(12) United States Patent
Cho (10) Patent No.: US 11,538,838 B2
(45) Date of Patent: Dec. 27, 2022

(54) IMAGE SENSING DEVICE (71) Applicant: SK hynix Inc., Icheon-si (KR)

(72) Inventor: Min Su Cho, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 138 days.

(21) Appl. No.: 16/846,876

(22) Filed: Apr. 13, 2020

(65) Prior Publication Data

US 2021/0091131 A1 Mar. 25, 2021

(30) Foreign Application Priority Data

Sep. 24, 2019 (KR) .......................... 10-2019-0117732

(51) Int. Cl.
*H01L 27/146* (2006.01)

(52) U.S. Cl.
CPC .... *H01L 27/14621* (2013.01); *H01L 27/1463* (2013.01); *H01L 27/14605* (2013.01); *H01L 27/14627* (2013.01); *H01L 27/14645* (2013.01); *H01L 27/14685* (2013.01)

(58) Field of Classification Search
None
See application file for complete search history.

(56) References Cited

U.S. PATENT DOCUMENTS

| 9,520,429 | B2* | 12/2016 | Kim | H01L 27/14621 |
| 2008/0054386 | A1* | 3/2008 | Akram | H01L 27/14687 |
| | | | | 438/70 |
| 2017/0133414 | A1* | 5/2017 | Chiang | H01L 27/14689 |
| 2017/0236858 | A1* | 8/2017 | Oh | H01L 27/1463 |
| | | | | 257/292 |
| 2019/0386049 | A1* | 12/2019 | Jung | H01L 27/1463 |

FOREIGN PATENT DOCUMENTS

| KR | 19-2009-0077901 A | 7/2009 |
| KR | 10-2016-0072513 A | 6/2016 |

* cited by examiner

*Primary Examiner* — Ali Naraghi
(74) *Attorney, Agent, or Firm* — Perkins Coie LLP (57) ABSTRACT

Designs of image sensing devices by including a substrate layer including a plurality of photoelectric conversion elements, a plurality of grid structures disposed over the substrate layer, a plurality of color filter layers each of which is disposed between adjacent grid structures, a plurality of over-coating layers formed over the color filter layers, and a plurality of microlenses formed over the over-coating layers. Each of the grid structures includes an air layer, and a capping film formed to cap the air layer, and an upper portion of the air layer is formed to protrude upward from the over-coating layer.

14 Claims, 12 Drawing Sheets

IMAGE SENSING DEVICE

CROSS-REFERENCE TO RELATED APPLICATION

This patent document claims the priority and benefits of Korean patent application No. 10-2019-0117732, filed on Sep. 24, 2019, which is incorporated by reference in its entirety as part of the disclosure of this patent document.

TECHNICAL FIELD

The technology and implementations disclosed in this patent document generally relate to an image sensing device.

BACKGROUND

An image sensor is a device for converting an optical image into electrical signals. With the recent development of automotive, medical, computer and communication industries, the demand for high-performance image sensors is increasing in various devices such as digital cameras, camcorders, personal communication systems (PCSs), game consoles, surveillance cameras, medical micro-cameras, robots, etc.

SUMMARY

The embodiments of the disclosed technology, among other features and benefits, relate to an image sensing device with increased light receiving efficiency that can avoid structural damages due to expansion of air grids.

In some embodiments of the disclosed technology, an image sensing device may include a substrate layer including a plurality of photoelectric conversion elements, a plurality of grid structures disposed over the substrate layer and structured to provide optical isolation between adjacent photoelectric conversion elements, a plurality of color filter layers disposed over the substrate layer, each color filter layer being disposed between adjacent grid structures, a plurality of over-coating layers formed over the plurality of color filter layers, respectively, and a plurality of microlenses formed over the plurality of over-coating layers, respectively. Each of the plurality of grid structures may include an air layer, and a capping film formed to cover the air layer. An upper portion of the air layer may be formed to protrude upward from the over-coating layer.

In some embodiments of the disclosed technology, an image sensing device may include a substrate layer including a plurality of photoelectric conversion elements, a plurality of grid structures disposed over the substrate layer and structured to provide optical isolation between adjacent photoelectric conversion elements, a plurality of color filter layers disposed over the substrate layer, each color filter layer being disposed between adjacent grid structures, and a plurality of lens layers disposed over the plurality of color filter layers, respectively. Each of the plurality of grid structures includes an air layer and a capping film formed to surround a top surface and a side surface of the air layer.

In some embodiments of the disclosed technology, an image sensing device may include an image sensing device may include a substrate layer including at least one photoelectric conversion element, grid structures disposed over the substrate layer, at least one color filter layer disposed between the grid structures, at least one over-coating layer formed over the color filter layer, and microlenses formed over the over-coating layer. Each of the grid structures may include an air layer, and a capping film formed to cap the air layer. Some parts of the air layer may be formed to protrude upward from the over-coating layer.

In some embodiments of the disclosed technology, an image sensing device may include a substrate layer including at least one photoelectric conversion element, grid structures disposed over the substrate layer, at least one color filter layer disposed between the grid structures, and a lens layer disposed over the color filter layer. The grid structures includes an air layer and a capping film formed to surround a top surface and a side surface of the air layer.

DETAILED DESCRIPTION

Figure 1:
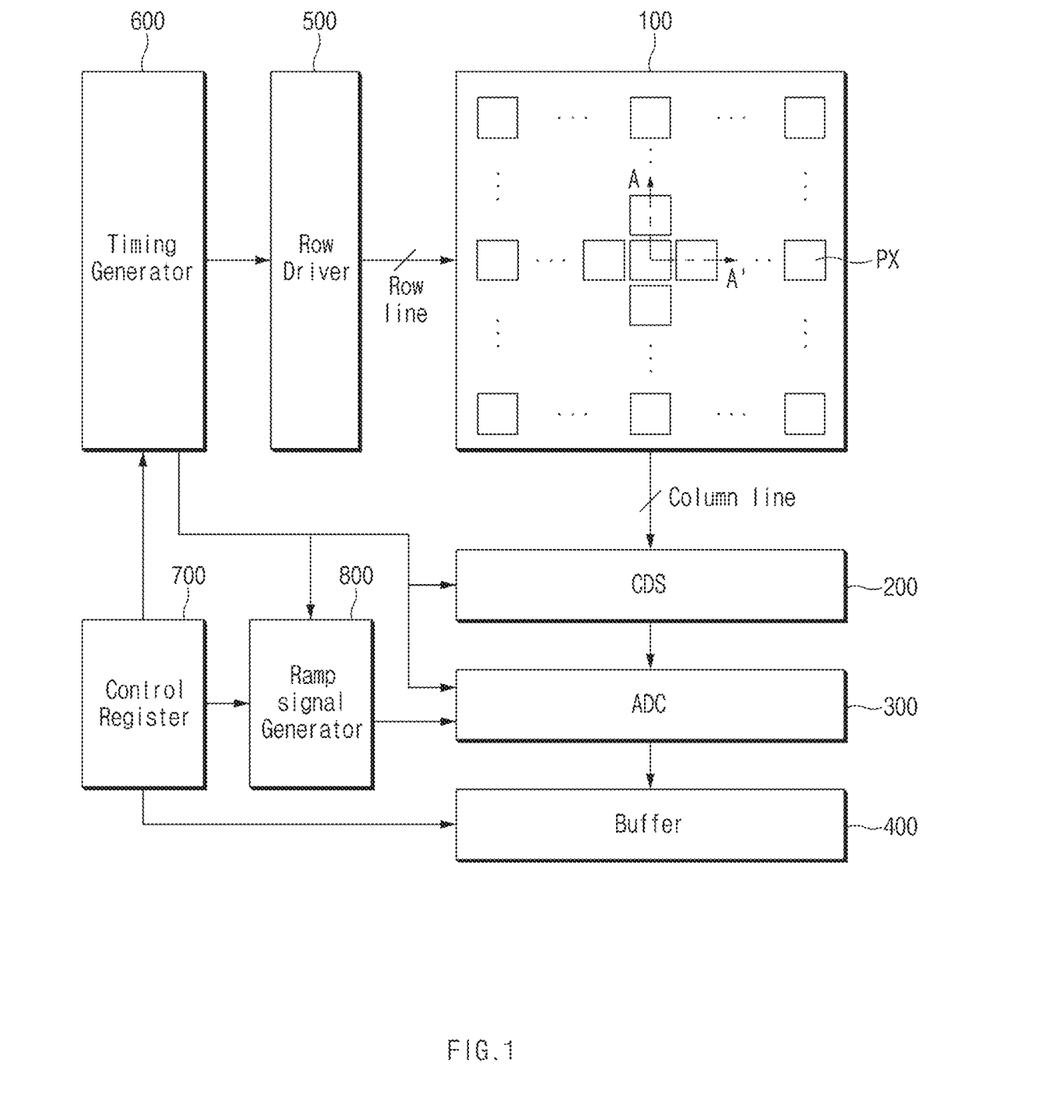
FIG. 1 is an example of a block diagram illustrating an image sensing device based on some implementations of the disclosed technology.

This patent document provides implementations and examples of image sensing devices that improves light receiving efficiency while avoiding structural damages due to expansion of an air grid, FIG. 1 is an example of a block diagram illustrating an image sensing device based on some implementations of the disclosed technology.

In some implementations, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include unit pixels (PXs) consecutively arranged in a two-dimensional (2D) structure in which unit pixels are arranged in a first direction and a second direction perpendicular to the first direction. Each of the unit pixels (PXs) may convert incident light into an electrical signal to generate a pixel signal, and may output the pixel signal to the correlated double sampler (CDS) 200 through column lines. Each of the unit pixels (PXs) may be coupled to one of row lines and one of column lines. The pixel array 100 may include a grid structure to electrically and/or optically isolate the unit pixels from neighboring unit pixels, thereby minimizing crosstalk between contiguous pixels. A grid structure implemented based on some embodiments of the disclosed technology may include an air layer and a capping film for maintaining the structure of the air layer. In one example, the capping film forms a structure that maintain the air layer inside the structure. In some embodiments of the disclosed technology, the air layer of the grid structure extends to the area where the lens layer is formed. As will be shown in a cross-sectional views of the pixel array (e.g., FIG. 2), the grid structure based on some embodiments of the disclosed technology is formed such that the upper parts of the air layer protrude outward from the lens layer.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured.

In some embodiments of the disclosed technology, the correlated double sampler (CDS) 200 may hold and sample electrical image signals received from the pixels (PXs) of the pixel array 100. For example, the correlated double sampler (CDS) 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

The analog-to-digital converter (ADC) 300 is used to convert analog CDS signals to digital signals. Examples of the analog-to-digital converter (ADC) 300 may include a ramp-compare type analog-to-digital converter that compares the analog pixel signal with a reference signal such as a ramp signal that ramps up or down, and a timer counts until a voltage of the ramp signal matches the analog pixel signal. In some embodiments of the disclosed technology, the analog-to-digital converter (ADC) 300 may compare a ramp signal received from the ramp signal generator 800 with a sampling signal received from the correlated double sampler (CDS) 200 to output a comparison signal indicating the result of comparison between the ramp signal and the sampling signal. The analog-to-digital converter (ADC) 300 may count the number of times the sampling signal is sampled, which can be represented as the number of level transitions of the comparison signal in response to a clock signal received from the timing generator 600, and may output a count value indicating the number of level transitions to the buffer 400.

The buffer 400 may temporarily store the electrical signals (indicating digital values) received from the analog-to-digital converter (ADC) 300 (amplify the electrical signals if necessary), and may output the electrical signals. In one example, the buffer 400 may include a memory (not shown) and a sense amplifier (not shown). The memory may store the count value, which indicates output signals of the plurality of unit pixels (PXs). The sense amplifier may sense and amplify the voltage level stored in the memory to accurately indicate the count value.

The row driver 500 may drive the pixel array 100 on a row line basis in response to an output signal of the timing generator 600. For example, the row driver 500 may generate a selection signal capable of selecting any one of the plurality of row lines.

The timing generator 600 may generate a timing signal to control or operate the row driver 500, the correlated double sampler (CDS) 200, the analog-to-digital converter (ADC) 300, and the ramp signal generator 800.

The control register 700 may generate control signals to control or operate the ramp signal generator 800, the timing generator 600, and the buffer 400.

The ramp signal generator 800 may generate a ramp signal to be used to sample the output signals of the correlated double sampler (CDS) 200 in response to a control signal received from the timing generator 600.

Figure 2:
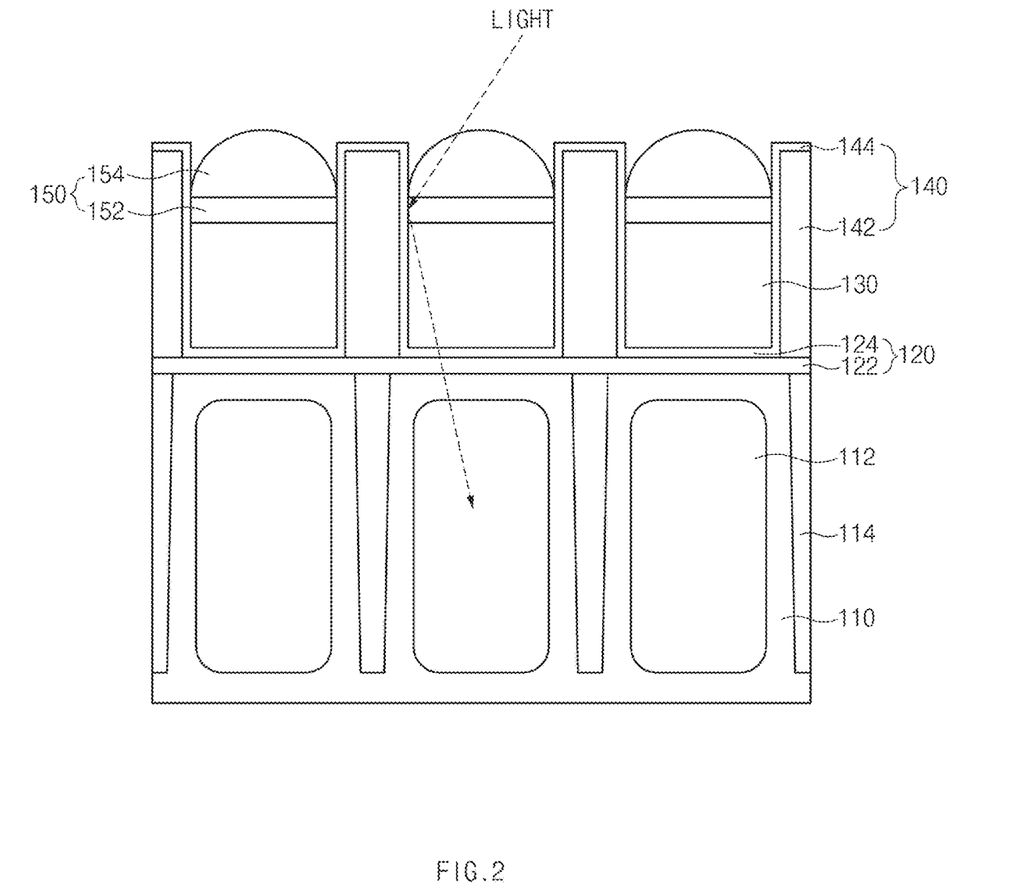
FIG. 2 is a cross-sectional view illustrating an example of a pixel array taken along the line A-A' shown in FIG. 1.

FIG. 2 is a cross-sectional view illustrating an example of the pixel array taken along the line A-A' shown in FIG. 1.

In some embodiments of the disclosed technology, the pixel array 100 of the image sensing device may include a substrate layer 110, a buffer layer 120, a color filter layer 130, a grid structure 140, and a lens layer 150.

The semiconductor substrate layer 110 may include a semiconductor substrate. The semiconductor substrate 110 may include a monocrystalline material such as a silicon-containing material. In one example, the semiconductor substrate 110 may include a monocrystalline silicon. In some implementations, P-type impurities are doped in the semiconductor substrate 110. In the semiconductor substrate 110, unit pixels (PX) each including a photoelectric conversion element 112 are formed such that photoelectric conversion elements 112 are isolated from adjoining photoelectric conversion elements 112 by device isolation layers 114.

Examples of the photoelectric conversion elements 112 may include an organic or inorganic photodiode. The photoelectric conversion element 112 may include multiple impurity regions, such as p-type region and n-type region, that are in contact with each other. In some implementations, such multiple impurity regions are vertically arranged within the semiconductor substrate layer 110. For example, each of the photoelectric conversion elements 112 may include an N-type impurity region and a P-type impurity region that are vertically stacked on top of one another to form a photodiode. The N-type impurity region and the P-type impurity region may be formed by ion implantation techniques. The device isolation layer 114 may include a deep trench isolation (DTI) structure.

The buffer layer 120 may be formed for planarization purposes to leave a layer having an even, planar surface above the structures formed in the semiconductor substrate layer 110. In some implementations, the buffer layer 120 is substantially transparent to light. In addition, the buffer layer 120 may operate as an anti-reflection film to allow incident light received through the lens layer 150 and the color filter layers 130 to pass through the photoelectric conversion elements 112 of the semiconductor substrate layer 110. The buffer layer 120 may be formed of a multilayer structure formed by stacking different material layers having different refractive indices. For example, the buffer layer 120 may include a multilayer structure formed by stacking a nitride film 122 and an oxide film 124, The nitride film 122 may include a silicon nitride film ($Si_xN_y$, where each of 'x' and 'y' is a natural number) or a silicon oxide nitride film ($Si_xO_yN_z$, where each of 'x', 'y', and 'z' is a natural number). The oxide film 124 may include a monolayer structure formed of any one of an undoped silicate glass (USG) film and an ultra low temperature oxide (ULTO) film, or may include a multilayer structure formed by stacking the USG film and the ULTO film. In some implementations, the oxide film 124 and the capping film 144 of the grid structure 140 may be formed simultaneously. For example, the oxide film 124 may be formed of the same material as the capping film 144 of the grid structure 140, and the oxide film 124 and the capping film 144 may be simultaneously formed through the same deposition process.

The color filter layer 130 may include optical filters located above the photoelectric conversion elements 112 to filter the light to be detected by the photoelectric conversion elements 112. In some implementations, the color filter layer 130 may transmit visible light at a certain wavelength while blocking light at other wavelengths. The color filter layer 130 may include a plurality of color filters. Each unit pixel (PX) includes at least on color filter, and the color filters may be formed to fill the lower parts of the gaps between the grid structures 140. The color filter layer 130 may include a plurality of red color filters (Rs), a plurality of green color filters (Gs), and a plurality of blue color filters (Bs). Each red color filter (R) may transmit only red light from among RGB lights of visible light. Each green color filter (G) may transmit only green light from among RGB lights of visible light. Each blue color filter (B) may transmit only blue light from among RGB lights of visible light. The red filters (Rs), the green filters (Gs), and the blue filters (Bs) may be arranged in a Bayer pattern shape. Alternatively, the color filter layer 130 may include a plurality of cyan filters, a plurality of yellow filters, and a plurality of magenta filters.

The grid structure 140 may include an air layer 142 and a capping film 144. The capping film 144 may be a material film that is formed at an outermost part of the grid structure 140 to define the area where the air layer 142 is formed.

In some embodiments of the disclosed technology, the grid structure 149 may be formed such that upper portions of the air layer 142 and the capping film 144 protrude outward from the lens layer 150. In some embodiments of the disclosed technology, the grid structure 140 may be formed such that top portions of the air layer 142 are placed at a higher position than bottom portions of the lens layer 150. In some embodiments of the disclosed technology where the lens layer 150 includes an over-coating layer 152 and a microlens 154, the grid structure 140 may be formed such that top portions of the air layer 142 are placed at a higher position than the over-coating layer 152 of the lens layer 150. In some embodiments of the disclosed technology, a top surface of the grid structure 140 may be placed at a lower position than a top surface of the microlens 154.

The air layer 142 may be formed to protrude outward from the bottom portions (or the top portions) of the lens layer 150 as described above, the grid structure 140 may be formed in a manner that incident light can also be reflected from the over-coating layer 152 and/or a portion of the grid structure 140 in contact with the over-coating layer 152 toward each pixel (PX) region as depicted with arrows in FIG. 2, so that more light beams may be introduced into photoelectric conversion elements of the corresponding pixel.

In addition, air expansion in the air layer can possibly rupture the grid structure. The air layer 142 formed to protrude outward from the lens layer 150 (e.g., bottom portions of the lens layer 150) based on some embodiments of the disclosed technology may lower the risk of rupture by dispersing or lowering the internal pressure.

For example, the air layer 142 formed to protrude outward from the lens layer 150 (e.g., bottom portions of the lens layer 150) such that a top surface of the grid structure 140 is not in contact with the adjacent color filter layers. The expansion in the air layer 142 can apply to surrounding color filter layers at both sides of the grid structure 140 and the lens layer 150. The grid structure 140 based on some embodiments of the disclosed technology, however, can lower the internal pressure by, for example, emitting the expanded air outside the grid structure 140 through the capping film 144 on the protruded portion of the air layer 142. To this end, the capping film 144 may be formed of a material film that can pass the expanded air therethrough.

For example, the capping film 144 may include an ultra low temperature oxide (ULTO) film such as a silicon oxide film $SiO_2$).

In some embodiments of the disclosed technology, the capping film 144 may be formed to extend to below the color filter layer 130. In this case, the capping film formed below the color filter layer 130 may be used as the oxide film 124 of the buffer layer 120.

The lens layer 150 may converge incident light beams received from the outside toward the color filter layers 130. The lens layer 140 may be formed over the color filter layer 130, and at least the bottom portion of the lens layer 140 may be located between the protruded portions of the grid structures 140. In an implementation, the lens layer 150 may be located below the top surfaces of the grid structures 140. In another implementation, the top surfaces of the grid structures 140 may be at the same or similar height as the top surface of the lens layer 150. The lens layer 150 may include an over-coating layer 152, which is formed for planarization purposes, and a microlens 154, which is formed over the over-coating layer 152. The over-coating layer 152 may be formed of the same materials as in the microlens 154. For example, the over-coating layer 152 may include polymeric organic materials.

Figure 3:
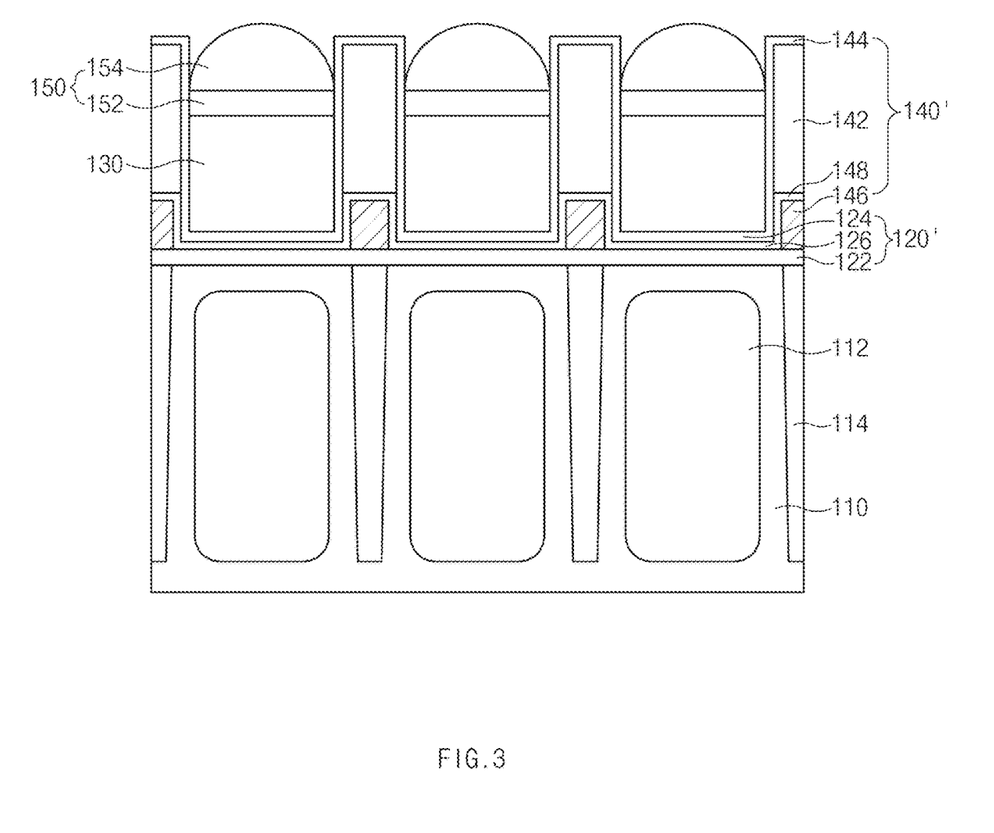
FIG. 3 is a cross-sectional view illustrating another example of the pixel array taken along the line A-A' shown in FIG. 1.

FIG. 3 is a cross-sectional view illustrating another example of the pixel array taken along the line A-A' shown in FIG. 1.

The grid structure 140' and the buffer layer 120' of the image sensing device shown in FIG. 3 are slightly different in structure from those of the image sensing device shown in FIG. 2.

Referring to FIG. 3, the grid structure 140' may include a metal layer 146, an insulation film 148, an air layer 142, and a capping film 144. In other words, the grid structure 140' may be formed as a hybrid structure in which the metal layer 146 is formed below the air layer 142.

The metal layer 146 may include tungsten (W). Alternatively, the metal layer 146 may include a tungsten film and a barrier metal layer formed below the tungsten film.

The insulation film 148 may be formed to cover the metal layer 146, to prevent metal material from excessively expanding during a thermal annealing process. The insulation film 148 may be formed to extend to below the color filter layer 130. In this case, the insulation film formed below the color filter layer 130 may be used as the insulation film 126 of the buffer layer 120. That is, although the insulation films 148 and 126 are depicted to be distinguished from each other for convenience of description, in another implementation the two insulation films 148 and 126 may be simultaneously formed through the same deposition process. Each of the insulation films 148 and 126 may include a silicon nitride film ($Si_xN_y$, where each of 'x' and 'y' is a natural number) or a silicon oxide nitride film ($Si_xO_yN_z$, where each of 'x', 'y', and 'z' is a natural number).

The air layer 142 may be formed over the insulation film 148, and each of the air layer 142 and the insulation film 148 may be capped by the capping film 144.

FIGS. 4A to 4E are cross-sectional views illustrating examples of a method for forming the buffer layer, the color filter layer, the grid structure, the lens layer shown in FIG. 3 based on some implementations of the disclosed technology. The photoelectric conversion element 112 (not shown in FIGS. 4A to 4E) and the device isolation layer 114 (not shown in FIGS. 4A to 4E) over the semiconductor substrate 110 are first formed before the buffer layer, the color filter layer, the grid structure, the lens layer are formed.

For convenience of description, FIGS. 4A to 4E illustrate only one unit pixel (PX) as an example.

Figure 4A:
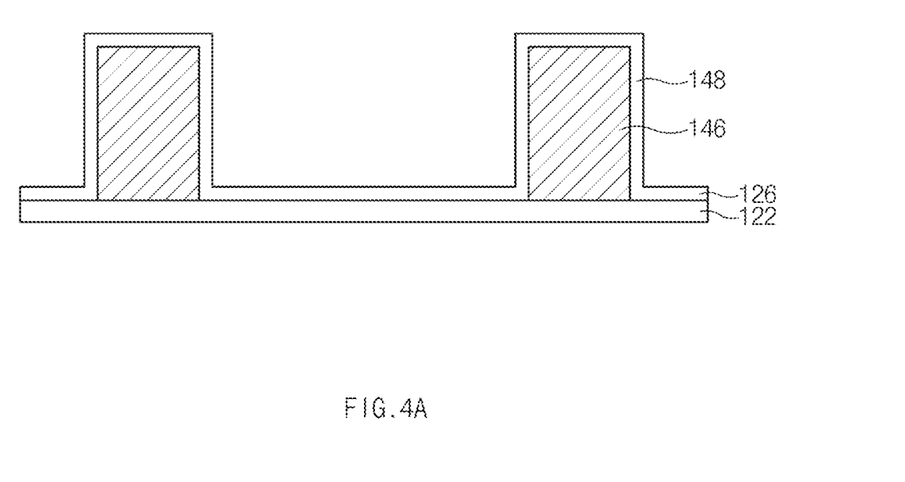
FIGS. 4A to 4E are cross-sectional views illustrating examples of a method for forming a buffer layer, a color filter layer, a grid structure, a lens layer shown in FIG. 3 based on some implementations of the disclosed technology.

Referring to FIG. 4A, the metal layer 146 may be formed over the nitride film 122.

For example, a metal material (e.g., tungsten W) may be formed over the nitride film 122. Thereafter, the metal material may be patterned using a mask pattern (not shown) defining a region of the metal layer of the grid structure to form the metal layer 146. In some implementations, a barrier metal material may be formed before forming the metal material, and thus the metal material may be formed over the barrier metal material.

Subsequently, the insulation film 126 may be formed over the nitride film 122, and the insulation film 148 may be formed over the metal layer 146.

In this case, the insulation film 126 formed over the nitride film 122 may be used as a part of the buffer layer 120', and the insulation film 148 formed on the metal layer 146 may be used as a part of the grid structure. Each of the insulation films 126 and 148 may include a silicon nitride film ($Si_xN_y$, where each of 'x' and 'y' is a natural number) or a silicon oxide nitride film ($Si_xO_yN_z$, where each of ix', 'y', and 'z' is a natural number).

Figure 4B:
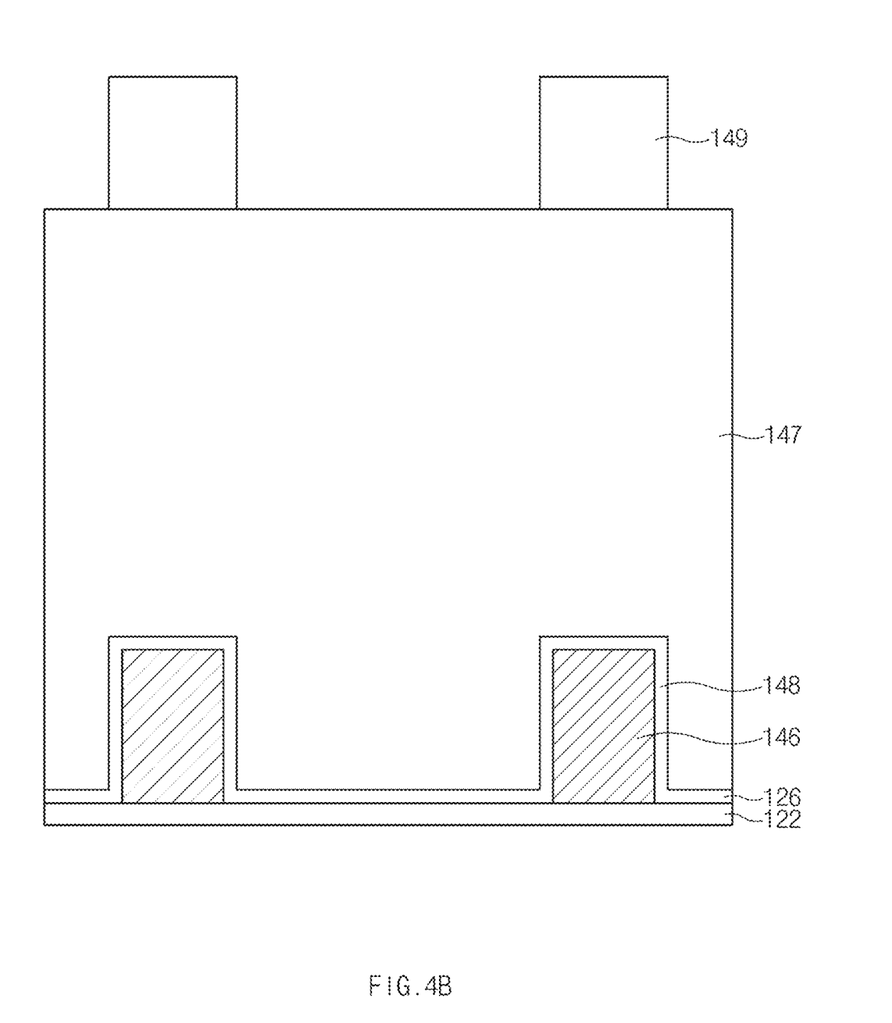

Referring to FIG. 4B, a sacrificial film 147 may be formed over the insulation films 126 and 148. In this case, the sacrificial film 147 may include a carbon-containing spin on carbon (SOC) film.

Subsequently, a mask pattern 149 defining a region of the air layer 142 of the grid structure 140 may be formed over the sacrificial film 147.

The mask pattern 149 may include a photoresist pattern.

Figure 4C:
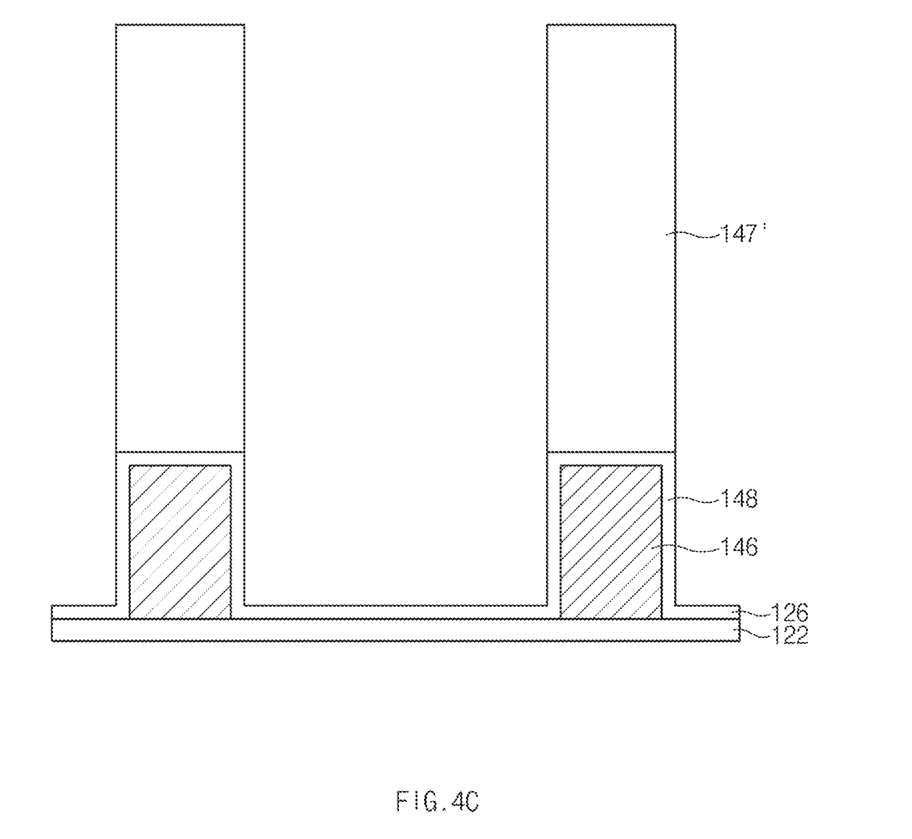

Referring to FIG. 4C, the sacrificial film 147 may be etched using the mask pattern 149 as an etch mask, such that the sacrificial film pattern 147' may be formed over the insulation film 143.

Figure 4D:
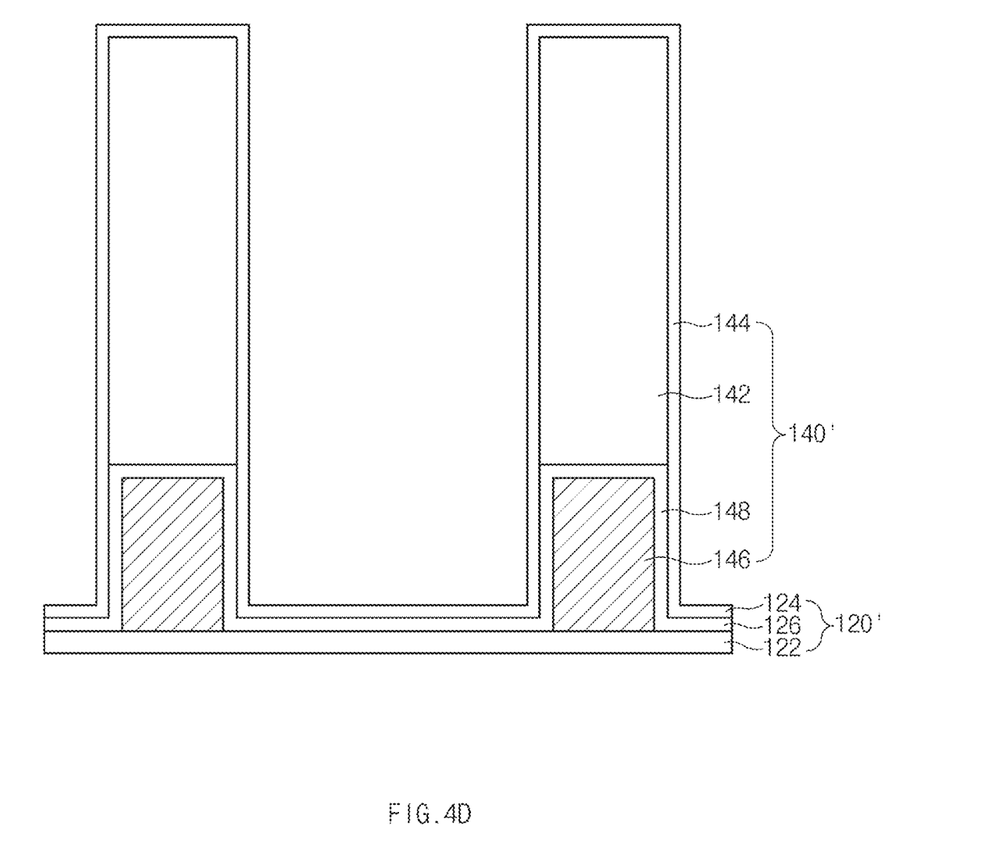

Referring to FIG. 4D, capping films 144 and 124 may be formed over the insulation films 126 and 148 and the sacrificial film 147'.

Each of the capping films 144 and 124 may include an oxide film such as a ULTO film. Specifically, the capping film 144 may be formed to a predetermined thickness through which molecules formed by combining gas to be used in a subsequent plasma process with carbon of the sacrificial film pattern 147' can be easily discharged outside. In some implementations, the capping film 144 may be formed to a thickness of 300 Å or less.

Subsequently, the plasma process may be carried out to remove the sacrificial film pattern 147' and form the air layer 142 at the position from which the sacrificial film pattern 147' is removed. In this case, the plasma process may be carried out using gas (e.g., $O_2$, $N_2$, $H_2$, CO, $CO_2$, or $CH_4$) including at least one of oxygen, nitrogen, or hydrogen.

For example, if the $O_2$ plasma process is carried out upon the resultant structure of FIG. 4D, oxygen radicals (O*) may flow into the sacrificial film pattern 147' through the capping film 144, and the oxygen radicals (O*) included in the sacrificial film pattern 147' may be combined with carbons of the sacrificial film pattern 147', resulting in formation of CO or $CO_2$. The formed CO or $CO_2$ may be discharged outside through the capping film 144. As a result, the sacrificial film pattern 147' may be removed, and the air layer 142 may be formed at the position from which the sacrificial film pattern 147' is removed.

Figure 4E:
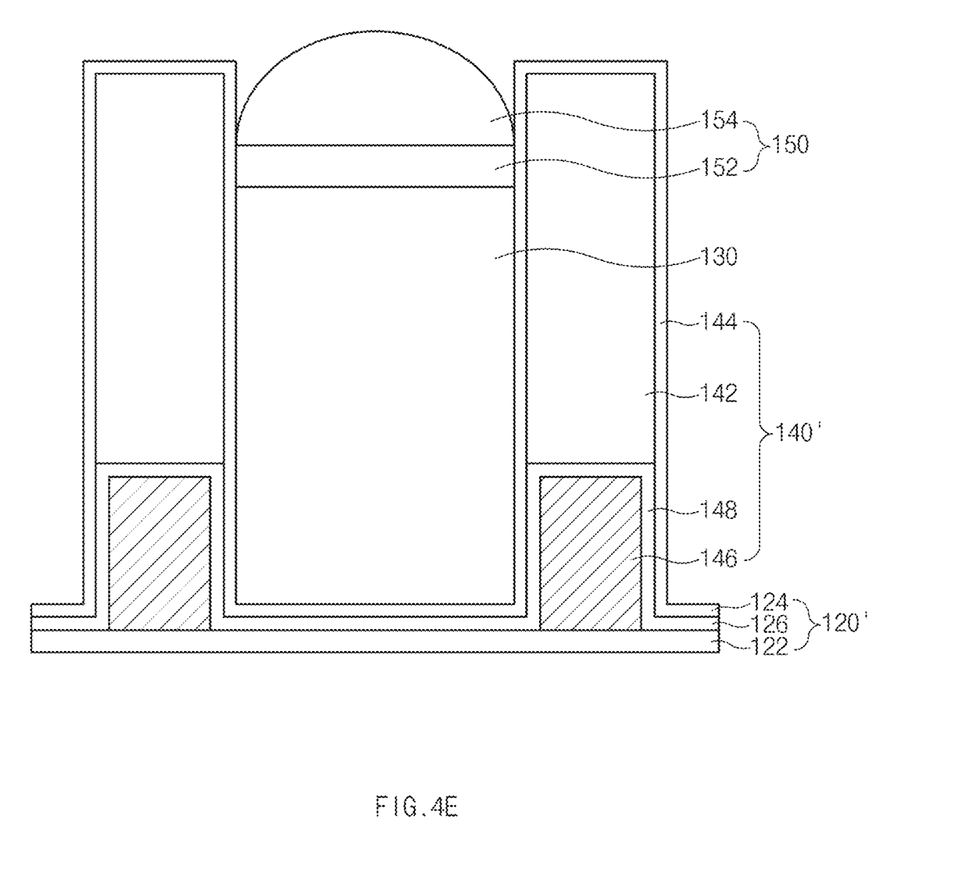

Referring to FIG. 4E, the color filter materials may be formed over the buffer layer 120 so as to fill each gap between the grid structures 140, and some parts of the color filter materials may be etched, so that the color filter layers 130 may be formed between the grid structures 140'. The color filter materials may be partially removed or etched through $O_2$ descum processing.

In this case, a top surface of each color filter layer 130 may be located below a top surface of each grid structure 140'. That is, the color filter layer 130 may not be formed to a predetermined height in the upper region of a region interposed between the grid structures 140'.

Subsequently, the over-coating layer 152 and the microlens 154 may be sequentially formed over the color filter layer 130.

The over-coating layer 152 may be formed to provide an even, planar surface to form the microlens 154 thereon, and the over-coating layer 152 and the microlens 154 may be formed of the same materials. The over-coating layer 152 and the microlens 154 may be disposed between the grid structures 140.

Figure 5:
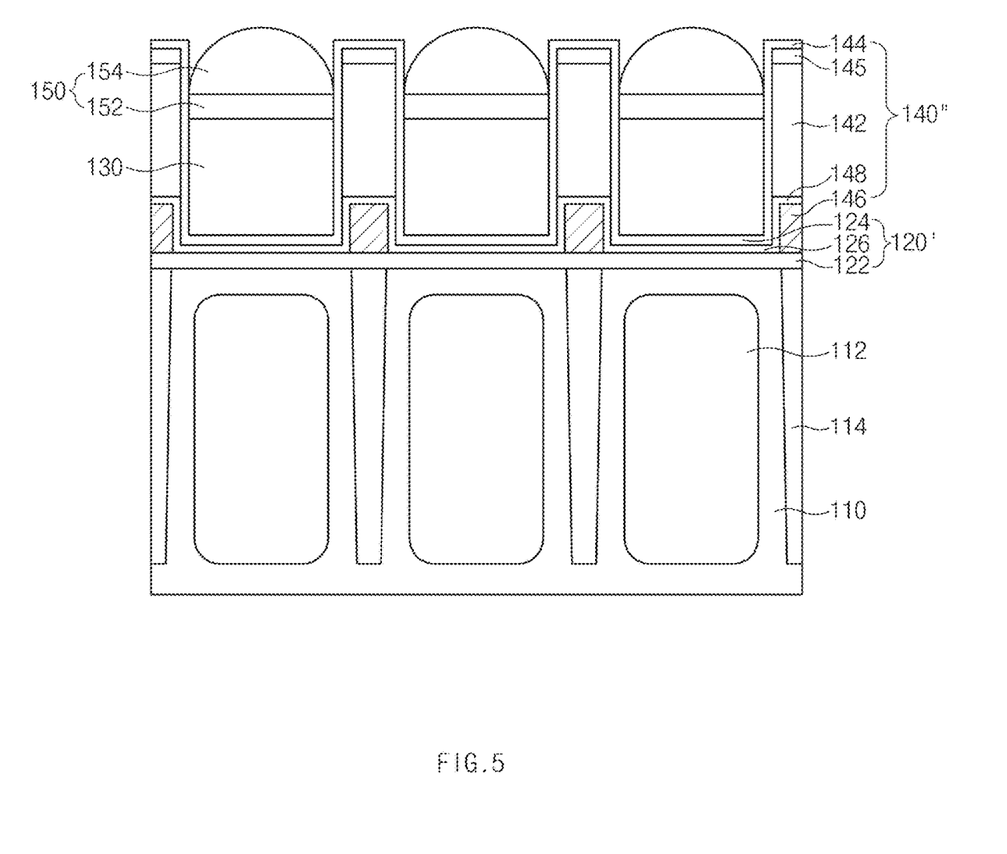
FIG. 5 is a cross-sectional view illustrating another example of the pixel array taken along the line A-A' shown in FIG. 1.

FIG. 5 is a cross-sectional view illustrating another example of the pixel array taken along the line A-A' shown in FIG. 1.

In some embodiments of the disclosed technology, the grid structure 140" may include a metal layer 146, an insulation film 148, an air layer 142, a support film 145, and a capping film 144. Unlike the grid structure 140' of FIG. 3, the grid structure 140" shown in FIG. 5 may further include a support film 145 formed over the air layer 142.

In this case, the support film 145 may be formed to maintain the shape of the grid structure 140, and may prevent collapse of the capping film 144 in a subsequent process for forming the air layer 142 in the grid structure 140. For example, in order to prevent collapse of the capping film in a process for removing the sacrificial film pattern through the 02 plasma process as illustrated in FIG. 4D, the support film 145 may be formed. In this case, a support material layer may be formed prior to formation of the mask pattern 149 in the process of FIG. 4B, the sacrificial film 147 and the support material layer may be simultaneously patterned using the mask pattern 149, resulting in formation of the support film 145.

The support film 145 may include at least one of a silicon oxide nitride film ($Si_xO_yN_z$, where each of 'x', 'y', and 'z' is a natural number), a silicon oxide film ($Si_xO_y$, where each of 'x' and 'y' is a natural number), and a silicon nitride film ($Si_xN_y$, where each of 'x' and 'y' is a natural number).

Although the support film 145 is formed over the air layer 142, since protruded portions of the air layer 142 formed between the bottom of the lens layer 150 and the support film 145 are exposed, expansion of the air layer 142 can be prevented as described above.

The support film 145 according to the embodiment of the disclosed technology may also be formed in the grid structure 140 not including the metal layer as illustrated in FIG. 2.

Figure 6A:
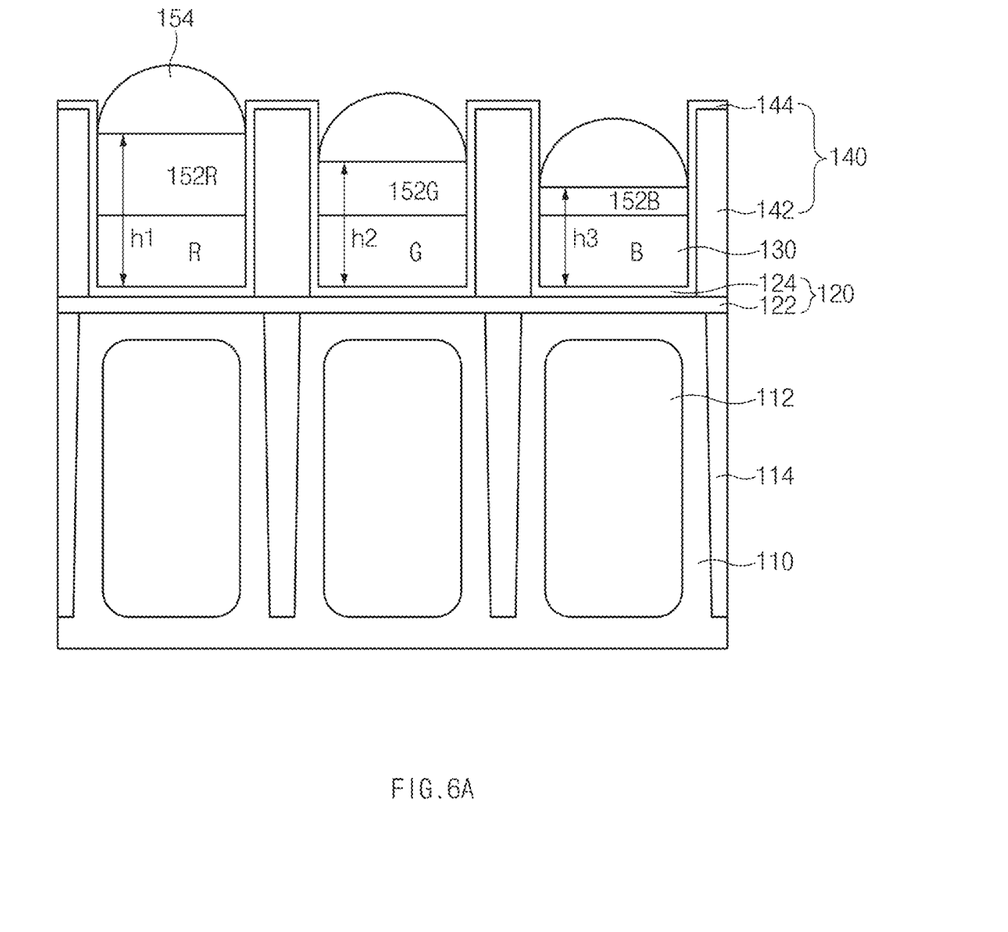
FIGS. 6A to 6C are cross-sectional views illustrating other examples of the pixel array taken along the line A-A' shown in FIG. 1.
Figure 6B:
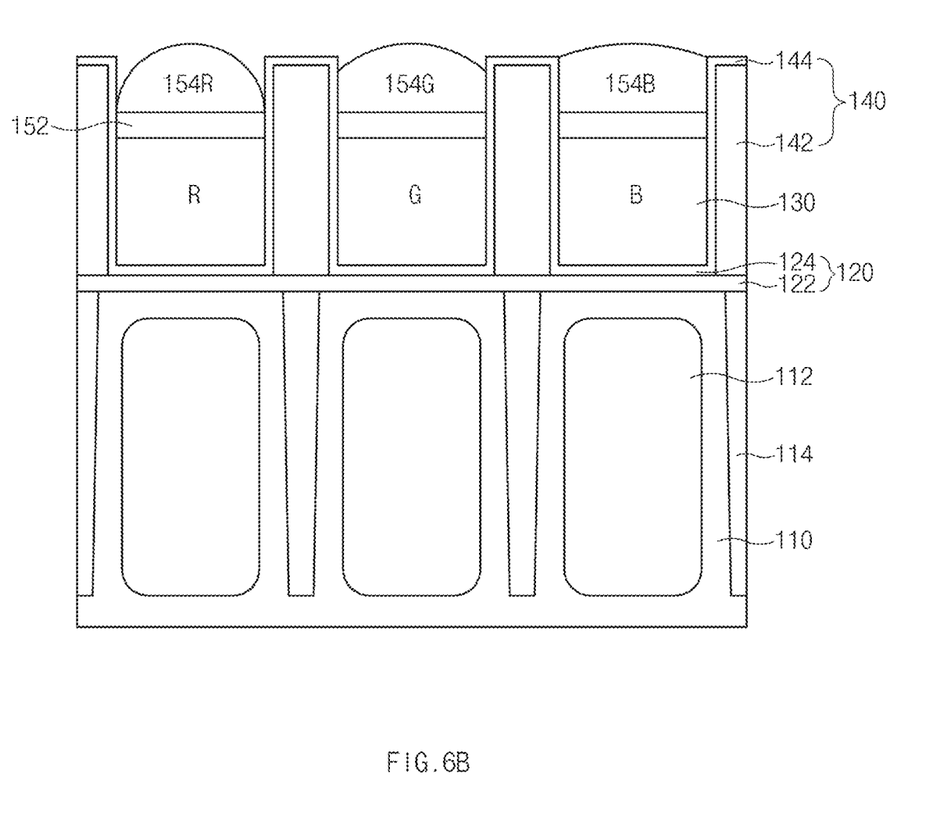
Figure 6C:
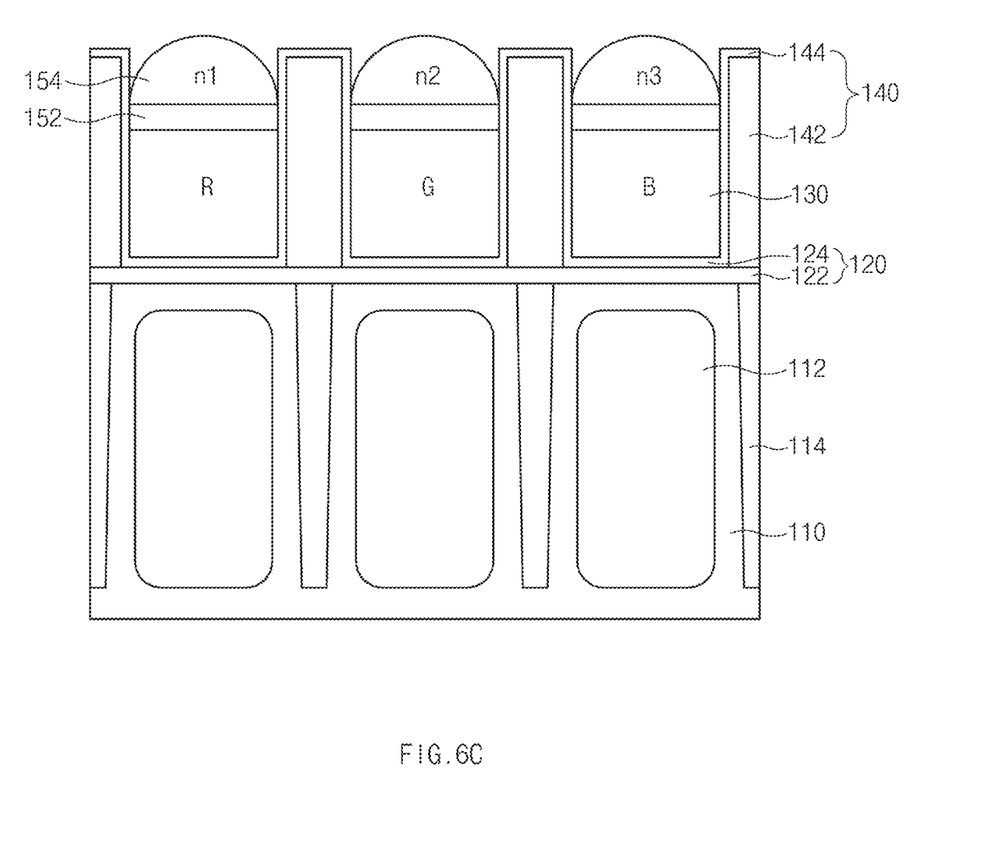

FIGS. 6A to 6C are cross-sectional views illustrating other examples of the pixel array taken along the line A-A' shown in FIG. 1.

Referring to FIGS. 6A to 6C, since incident light beams of respective colors may have different wavelengths, the incident light beams of respective colors filtered by the color filter layers 130 may be focused at different positions of the photoelectric conversion element 112.

Therefore, in order to allow the red light, the green light, and the blue light to be focused at the same position of the photoelectric conversion element 112 (e.g., at the center part of the photoelectric conversion element 112), at least one of a formation height of the microlens 154, a radius of curvature (RoC) of the microlens 154, and a refractive index of the microlens 154 may be adjusted according to the corresponding pixel color.

For example, as illustrated in FIG. 6A, the over-coating layers 152R, 152G, and 152B respectively corresponding to the red color filter, the green color filter, and the blue color filter may have different heights, such that a first height (h1) for formation of the microlens 154, a second height (h2) for formation of the microlens 154, and a third height (h3) for formation of the microlens 154 may be different from one another according to respective colors. Alternatively, as shown in FIG. 6B, the microlenses 154R, 154G, and 154B corresponding to respective colors may have different RoC (Radius of Curvature) values according to the respective colors. Alternatively, as shown in FIG. 6C, the microlenses corresponding to respective colors may have different refractive indices n1, n2, and n3 according to the respective colors.

Although FIGS. 6A to 6C exemplarily illustrate that only one from among the formation height, the RoC, and the refractive index of each microlens is adjusted for convenience of description, the scope of the disclosed technology is not limited thereto, and it should be noted that two or more of the formation height, the RoC, and the refractive index of each microlens can also be adjusted at the same time as necessary.

As is apparent from the above description, the image sensing device implemented based on the embodiments of the disclosed technology may increase light receiving efficiency and prevent expansion of the air grid that can lead to collapse or deformation of the air grid.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device comprising:
   a substrate layer including a plurality of photoelectric conversion elements;
   a plurality of grid structures disposed over the substrate layer and structured to provide optical isolation between adjacent photoelectric conversion elements;
   a plurality of color filter layers disposed over the substrate layer, each color filter layer being disposed between adjacent grid structures;
   a plurality of over-coating layers formed over the plurality of color filter layers, respectively; and
   a plurality of microlenses formed over the plurality of over-coating layers, respectively,
   wherein each of the plurality of grid structures includes:
   an air layer; and
   a capping film formed to cover the air layer,
   wherein an upper portion of the air layer is formed to protrude upward from the over-coating layer, and
   wherein the capping film is formed to extend to below the color filter layer to cover a bottom surface of the color filter layers.

2. The image sensing device according to claim 1, wherein the capping film includes an ultra low temperature oxide (ULTO) film.

3. The image sensing device according to claim 2, wherein the capping film includes silicon oxide ($SiO_2$).

4. The image sensing device according to claim 1, wherein top surfaces of the grid structures are formed at a lower position than top surfaces of the microlenses.

5. An image sensing device comprising:
   a substrate layer including a plurality of photoelectric conversion elements;
   a plurality of grid structures disposed over the substrate layer and structured to provide optical isolation between adjacent photoelectric conversion elements;
   a plurality of color filter layers disposed over the substrate layer, each color filter layer being disposed between adjacent grid structures; and
   a plurality of lens layers disposed over the plurality of color filter layers, respectively,
   wherein each of the plurality of grid structures includes:
   an air layer; and
   a capping film formed to surround a top surface and a side surface of the air layer,
   wherein the capping film is formed to extend to below the color filter layer to cover a bottom surface of the color filter layers.

6. The image sensing device according to claim 5, wherein the capping film includes an ultra low temperature oxide (ULTO) film.

7. The image sensing device according to claim 6, wherein the capping film includes silicon oxide ($SiO_2$).

8. The image sensing device according to claim 5, wherein the capping film includes silicon oxide ($SiO_2$).

9. The image sensing device according to claim 5, wherein upper portions of the grid structures are formed to protrude outward from the lens layer.

10. An image sensing device comprising:
    a substrate layer including a plurality of photoelectric conversion elements;
    a plurality of grid structures disposed over the substrate layer and structured to provide optical isolation between adjacent photoelectric conversion elements;
    a plurality of color filter layers disposed over the substrate layer, each color filter layer being disposed between adjacent grid structures; and
    a plurality of lens layers disposed over the plurality of color filter layers, respectively, such that a bottom portion of each lens layer is placed at a lower position than top portions of adjacent grid structures,
    wherein each of the plurality of grid structures includes:
    an air layer; and
    a capping film formed to surround a top surface and a side surface of the air layer, wherein the capping film is formed to extend to below the color filter layer to contact a bottom surface of the color filter layers.

11. The image sensing device according to claim 10, wherein the capping film includes an ultra low temperature oxide (ULTO) film.

12. The image sensing device according to claim 11, wherein the capping film includes silicon oxide ($SiO_2$).

13. The image sensing device according to claim 10, wherein the capping film includes silicon oxide ($SiO_2$).

14. The image sensing device according to claim 10, wherein upper portions of the grid structures are formed to protrude outward from the lens layer.

* * * * *